(12) United States Patent
Valette

(10) Patent No.: US 7,547,745 B2
(45) Date of Patent: Jun. 16, 2009

(54) EPOXY RESIN HARDENER OF ANHYDRIDE COPOLYMER AND ANHYDRIDE-ELASTOMER COPOLYMER

(75) Inventor: Ludovic Valette, Reichstett (FR)

(73) Assignee: Dow Global Technologies, Inc., Midland, MI (US)

( * ) Notice: Subject to any disclaimer, the term of this patent is extended or adjusted under 35 U.S.C. 154(b) by 0 days.

(21) Appl. No.: 11/972,986

(22) Filed: Jan. 11, 2008

(65) Prior Publication Data

US 2008/0108739 A1    May 8, 2008

Related U.S. Application Data

(63) Continuation of application No. 11/067,854, filed on Feb. 28, 2005, now abandoned.

(51) Int. Cl.
C08L 25/08 (2006.01)
C08L 63/00 (2006.01)
C08L 63/02 (2006.01)
C08L 63/04 (2006.01)

(52) U.S. Cl. .......................................... 525/71; 525/65

(58) Field of Classification Search .................. None
See application file for complete search history.

(56) References Cited

U.S. PATENT DOCUMENTS

| | | |
|---|---|---|
| 3,686,359 A | 8/1972 | Soldatos et al. |
| 3,789,038 A | 1/1974 | Curtis, Jr. et al. |
| 3,855,174 A | 12/1974 | Brié et al. |
| 4,028,432 A | 6/1977 | Dawans et al. |
| 4,028,437 A | 6/1977 | Rim et al. |
| 4,042,550 A | 8/1977 | Tuller et al. |
| 4,056,506 A | 11/1977 | Heilman et al. |
| 4,234,701 A | 11/1980 | Abolins et al. |
| 4,309,513 A | 1/1982 | Ueno et al. |
| 4,312,795 A | 1/1982 | Taguchi et al. |
| 4,341,695 A | 7/1982 | Lee et al. |
| 4,404,321 A | 9/1983 | Abolins et al. |
| 4,451,637 A | 5/1984 | Yamato et al. |
| 4,478,979 A | 10/1984 | Abolins et al. |
| 4,507,411 A | 3/1985 | Gordon et al. |
| 4,601,944 A | 7/1986 | Zussman |
| 4,661,560 A | 4/1987 | Abolins et al. |
| 4,661,561 A | 4/1987 | Abolins et al. |
| 4,782,114 A | 11/1988 | Perron et al. |
| 4,798,746 A | 1/1989 | Claar et al. |
| 4,812,513 A | 3/1989 | Hirose |
| 4,985,475 A | 1/1991 | Croft et al. |
| 5,041,254 A | 8/1991 | Gallo |
| 5,057,553 A | 10/1991 | Zagefka et al. |
| 5,215,863 A | 6/1993 | Nawata et al. |
| 5,300,569 A | 4/1994 | Drake et al. |
| 5,411,845 A | 5/1995 | Robinson |
| 5,629,379 A | 5/1997 | Harper |
| 5,690,994 A | 11/1997 | Robinson |
| 5,698,329 A | 12/1997 | Robinson |
| 5,770,312 A | 6/1998 | Robinson |
| 5,821,305 A | 10/1998 | Schutyser et al. |
| 5,844,047 A | 12/1998 | Abend |
| 5,962,586 A | 10/1999 | Harper |
| 6,093,774 A | 7/2000 | Dumain |
| 6,221,486 B1 | 4/2001 | Soane et al. |
| 6,333,064 B1 | 12/2001 | Gan |
| 6,387,492 B2 | 5/2002 | Soane et al. |
| 6,403,220 B1 | 6/2002 | Brennan et al. |
| 6,613,839 B1 | 9/2003 | Gan et al. |
| 6,667,107 B2 | 12/2003 | Tsuchikawa et al. |
| 6,897,247 B2 | 5/2005 | Fredrickson |
| 2002/0002244 A1 | 1/2002 | Hoelter et al. |
| 2002/0006515 A1 | 1/2002 | Luttnull |
| 2002/0076482 A1 | 6/2002 | Gan |
| 2002/0082350 A1 | 6/2002 | Tikart et al. |
| 2002/0119317 A1 | 8/2002 | Gan et al. |

FOREIGN PATENT DOCUMENTS

| | | |
|---|---|---|
| EP | 0 558 047 B1 | 5/1998 |
| FR | 1517845 | 3/1968 |
| GB | 2 148 900 A | 6/1985 |
| JP | 07316419 A | 12/1995 |
| JP | 09194610 A | 7/1997 |
| WO | WO 95/06075 | 3/1995 |
| WO | WO 98/18845 | 5/1998 |
| WO | WO 98/31750 | 7/1998 |
| WO | WO 00/27615 | 5/2000 |
| WO | WO 00/69232 | 11/2000 |
| WO | WO 00/76764 A1 | 12/2000 |

OTHER PUBLICATIONS

Chem Abstract 1998: 712128, JP 10292153, Nov. 4, 1998.
Derwent Abstract, 1979: 524485, FR 2398779A1, Feb. 23, 1979.

(Continued)

*Primary Examiner*—Robert Sellers

(57) ABSTRACT

A hardener composition useful for curing epoxy resins including a blend of (a) a carboxylic anhydride which is a copolymer of an ethylenically unsaturated anhydride and a vinyl compound; (b) a copolymer of an ethylenically unsaturated anhydride and an elastomer; and optionally (c) a stabilizing agent such as a block copolymer to prevent phase separation of components (a) and (b). The hardener composition is particularly useful in electrical laminates applications.

12 Claims, No Drawings

OTHER PUBLICATIONS

Derwent Abstract, 1983: 714234, JP 58098359, Sep. 25, 1993.
Derwent Abstract, 1990: 196071, JP 02127415A, May 16, 1990.
Derwent Abstract, 1990: 199985, JP 01304112A2, Dec. 7, 1989.
Derwent Abstract, 1997-451423, European Polymer Journal (1997), 33(6), 969-975.
Derwent Abstract, 1993-232524, JP 05156128A, Jun. 22, 1993.
Derwent Abstract, 1997:250094, JP 09025349A2, Jan. 28, 1997.
Derwent Abstract, 2001:54325, JP 2001019744A2, Jan. 23, 2001.
Chen et al., "Rubber Toughened Polyblends of Polycarbonate with Styrene Maleic-Anhydride Copolymer", Polymer Networks Blends, 1993, 107-114, vol. 3, Issue 2, ChemTec Publishing.
Kelnar, I, et al.; "Influence of the Additive Type and Modification on the Properties of Blends of Polyamide-6 With Poly(styrene-co-maleic Anhydride"; Polymer Engineering and Science; 1999; abstract only.

EPOXY RESIN HARDENER OF ANHYDRIDE COPOLYMER AND ANHYDRIDE-ELASTOMER COPOLYMER

CROSS-REFERENCE TO RELATED APPLICATION

This application is a continuation of U.S. patent application Ser. No. 11/067,854, filed Feb. 28, 2005, abandoned.

FIELD OF THE INVENTION

The present invention relates to compositions useful as crosslinkers for curing epoxy resins. More particularly, the present invention relates to a hardener composition useful as a crosslinker for curing epoxy resins. The epoxy resins, in turn, are used for example, in electrical laminates applications.

BACKGROUND OF THE INVENTION

It is known to make electrical laminates and other composites from a fibrous reinforcement and an epoxy-containing matrix resin. Examples of suitable processes usually contain the following steps:

(1) An epoxy-containing formulation is applied to or impregnated into a substrate by rolling, dipping, spraying, other known techniques and/or combinations thereof. The substrate is typically a woven or nonwoven fiber mat containing, for instance, glass fibers or paper.

(2) The impregnated substrate is "B-staged" by heating at a temperature sufficient to draw off solvent in the epoxy-containing formulation and optionally to partially cure the epoxy-containing formulation, so that the impregnated substrate can be handled easily. The "B-staging" step is usually carried out at a temperature of from 90° C. to 210° C. and for a time of from 1 minute to 15 minutes. The impregnated substrate that results from B-staging is called a "prepreg." The temperature is most commonly 100° C. for composites and 130° C. to 200° C. for electrical laminates.

(3) One or more sheets of prepreg are stacked or laid up in alternating layers with one or more sheets of a conductive material, such as copper foil, if an electrical laminate is desired.

(4) The laid-up sheets are pressed at high temperature and pressure for a time sufficient to cure the resin and form a laminate. The temperature of this lamination step is usually between 100° C. and 230° C., and is most often between 165° C. and 200° C. The lamination step may also be carried out in two or more stages, such as a first stage between 100° C. and 150° C. and a second stage at between 165° C. and 190° C. The pressure is usually between 50 N/cm$^2$ and 500 N/cm$^2$. The lamination step is usually carried out for a time of from 1 minute to 200 minutes, and most often for 45 minutes to 90 minutes. The lamination step may optionally be carried out at higher temperatures for shorter times (such as in continuous lamination processes) or for longer times at lower temperatures (such as in low energy press processes).

Optionally, the resulting laminate, for example, a copper-clad laminate, may be post-treated by heating for a time at high temperature and ambient pressure. The temperature of post-treatment is usually between 120° C. and 250° C. The post-treatment time usually is between 30 minutes and 12 hours.

It is conventional in the preparation of epoxy-containing laminates to incorporate into an epoxy resin composition a hardener (also referred to as a "curing agent" or a "crosslinking agent") in order to provide the crosslinking of the epoxy composition to form a thermoset resin. Various hardeners for epoxy resins are generally known including amines, phenolics, anhydrides, carboxylic acids, mercaptans and isocyanates. Epoxy resins can also homopolymerize by reacting with both nucleophilic and electrophilic species.

The current trend of the electrical laminates industry requires materials with improved dielectric properties including lower dielectric constant (Dk) and loss factor (Df); superior thermal properties including high glass transition temperature (Tg) and decomposition temperature (Td); and good processability. One known approach for improving laminate properties consists of curing a flame retardant epoxy resin with an anhydride hardener such as styrene-maleic anhydride copolymer (SMA). For example, the use of SMA as crosslinking agents for epoxy resins is described in U.S. Patent Application Publication No. 2002/0082350 A1. The main drawback of this known SMA hardener system is that it provides laminates with high brittleness. The known SMA hardener system also has poor processability because a prepreg powder made with the known SMA hardener is easy to remove from a substitute such as a glass web, creating a lot of dust when the prepreg is handled (a so-called "mushroom" effect). In addition, the resulting laminate made from the known SMA hardener system has a low toughness and is easy to delaminate, creating defects during drilling operations of the laminates. Often, the resulting prepreg also shows poor prepreg cosmetics due to entrapped gas bubbles.

It is therefore desired to provide a hardener system for epoxy resins without the disadvantages of the prior art.

SUMMARY OF THE INVENTION

One aspect of the present invention is directed to a hardener composition for epoxy resins, for example, epoxy resins used in the manufacture of electrical laminates. The hardener composition includes a blend of (a) a carboxylic anhydride which is a copolymer of an ethylenically unsaturated anhydride and a vinyl compound such as, for example, styrene-maleic anhydride (SMA) copolymer, (b) a copolymer of an ethylenically unsaturated anhydride and an elastomer such as, for example, a maleic anhydride-modified polybutadiene (PBMA), and, optionally, (c) a stabilizing agent, such as, for example, a styrene-butadiene-methyl methacrylate triblock polymer (SBM), to prevent phase separation of the SMA and PBMA. The components (a), (b), and (c), when present, are present in the blend at a preferred ratio to maintain the preferred properties of the hardener and the epoxy resin in which the hardener is used.

Another aspect of the present invention is directed to a curable epoxy resin composition containing the hardener composition described above.

Still another aspect of the present invention is directed to a prepreg or a laminate made from the above curable epoxy resin composition.

When the hardener composition of the present invention is used in an epoxy resin/hardener system, several advantages are obtained including for example, (i) an epoxy resin composition that will not have phase separation between the epoxy component and the additive components in the resin composition; (ii) an epoxy/hardener varnish which is a clear solution or a stable dispersion depending on the solvent used when an appropriate ratio of components (a), (b), and (c) is used; (iii) a partly cured B-staged prepreg that has improved prepreg properties including for example, an improved surface appearance and generates less dust during handling compared to standard SMA epoxy systems; (iv) a fully cured C-staged laminate that exhibits improved laminate properties including for example, improved toughness and less tendency to delaminate compared to standard SMA/epoxy systems or compared to epoxy resin systems with standard toughening agents; (v) a laminate having improved dielectric properties; and (vi) a laminate with enhanced thermal properties including for example, a high glass transition temperature and a high thermal resistance.

DETAILED DESCRIPTION OF THE PREFERRED EMBODIMENTS

Generally, the hardener system of the present invention includes a blend of (a) a carboxylic anhydride which is a copolymer of an ethylenically unsaturated anhydride and a vinyl compound, (b) a copolymer of an ethylenically unsaturated anhydride and an elastomer and, optionally, (c) a stabilizing agent, in the appropriate amounts to provide an effective hardener composition for epoxy resins.

The hardener composition of the present invention includes component (a) defined as a copolymer of (i) an ethylenically unsaturated anhydride, and (ii) a vinyl compound.

Copolymers of an ethylenically unsaturated anhydride and a vinyl compound include for example, styrene-maleic anhydride copolymer (SMA) and others, for example, as described in WO 95/06075, incorporated herein by reference.

Copolymers of styrene and maleic anhydride having a molecular weight ($M_w$) in the range of from 1500 to 50,000 and an anhydride content of more than 15 percent are particularly preferred. Commercial examples of these copolymer materials include SMA 1000, SMA 2000, SMA 3000 and SMA 4000 having styrene-maleic anhydride ratios of 1:1, 2:1, 3:1 and 4:1 respectively and molecular weight ranging from 6,000 to 15,000; and are commercially available from Atofina.

The hardener composition of the present invention also includes component (b) which is a copolymer of an etheylically unsaturated anhydride and an elastomer such as for example, a maleinized polybutadiene (PBMA). The PBMA used in the present invention may be a commercial available PBMA product such as Ricon® MA resins commercially available from Sartomer. The maleinized polybutadiene used in the present invention may also be prepared according to various known techniques for example by the reaction of polybutadiene with maleic anhydride as described in U.S. Pat. Nos. 4,028,437; 4,601,944; and 5,300,569, incorporated herein by reference.

The amounts of SMA and PBMA used in the hardener composition are such that the SMA to PBMA weight ratio is between about 99:1 and about 70:30, and preferably between about 95:5 and about 80:20.

The optional stabilizing agent, component (c) of the present invention, includes among others block copolymers with at least one block miscible with the dispersed phase and at least one block miscible with the continuous phase in order to avoid macro phase-separation. An example of a preferred stabilizing agent is a triblock polymer, styrene-co-butadiene-co-methyl methacrylate (SBM). The optional stabilizing agent is preferably added to the hardener composition of the present invention because without a stabilizing agent, the SMA/PBMA system phase separates. On the other hand, when SBM is used in the present hardener composition in the appropriate amount to form the appropriate ratio between SMA/PBMA/SBM, the hardener system of the present invention is a stable turbid dispersion (no phase separation and no settling).

The amounts of stabilizing agent when used in the hardener composition are such that the ratio of PBMA to stabilizing agent is generally between about 50:50 and about 99:1, preferably between about 60:40 and about 95:5, more preferably between about 75:25 and about 85:15.

The hardener composition may be dissolved in a solvent or a blend of solvents. Examples of suitable solvents include among others ketones, ethers, acetates, aromatic hydrocarbons, dimethylformamide, and cyclohexanone.

The hardener composition of the present invention may contain ingredients in addition to the hardener components discussed above. For example, the hardener composition may contain other different crosslinking agents, i.e. co-crosslinkers, such as those selected from the other known hardeners for epoxy resins including amines, phenolics, anhydrides, carboxylic acids, mercaptans and isocyanates.

Any of the well known co-crosslinkers described in U.S. Pat. Nos. 4,042,550 and 3,789,038, incorporated herein by reference, may be used in the present invention. As an illustration, known co-crosslinkers that may be used in the present invention, include for example, carboxylic acids such as oxalic acid, phthalic acid, terphthalic acid, and succinic acid; and anhydrides such as phthalic anhydride, succinic anhydride, hexahydrophthalic anhydride, tetrahydrophthalic anhydride, nadic anhydride and maleic anhydride.

The amount of co-crosslinker present in the hardener composition may be such that the SMA to co-crosslinker weight ratio is between about 99:1 and about 50:50, and preferably between about 95:5 and about 75:25.

The hardener composition of the present invention may be produced by mixing all of the components of the composition together in any order, preferably in solution form for example by dissolving the components in a solvent at a temperature of from about 20° C. and above; and preferably from about 20° C. to about 150° C.; and more preferably from about 60° C. to about 100° C. When the hardener solution is prepared at a low temperature, e.g. about ambient temperature (~25° C.), it takes a longer time for the components to dissolve in the solvent.

The hardener composition described above is advantageously used in combination with an epoxy resin to form a curable epoxy resin composition. The hardener composition of the present invention provides crosslinking between the hardener and the epoxy moieties of the epoxy resin to form a thermoset resin.

The epoxy resin component used in the curable epoxy resin composition is a polyepoxide. The polyepoxide compound useful in the practice of the present invention is suitably a compound which possesses more than one 1,2-epoxy group. In general, the polyepoxide compound is a saturated or unsaturated aliphatic, cycloaliphatic, aromatic or heterocyclic compound which possesses more than one 1,2-epoxy group. The polyepoxide compound can be substituted with one or more substituents such as lower alkyls and halogens. Such polyepoxide compounds are well known in the art. Illustrative polyepoxide compounds useful in the practice of the present invention are described in the *Handbook of Epoxy Resins* by H. E. Lee and K. Neville published in 1967 by McGraw-Hill, New York and U.S. Pat. No. 4,066,628, incorporated herein by reference.

Particularly useful polyepoxide compounds which can be used in the practice of the present invention are polyepoxides having the following general formula:

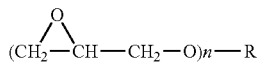

wherein R is substituted or unsubstituted aromatic, alphatic, cycloaliphatic or heterocyclic polyvalent group and n had an average value of from 1 to less than about 8.

As an illustration of the present invention, examples of known epoxy resins that may be used in the present invention, include for example, the diglycidyl ethers of resorcinol, catechol, hydroquinone, bisphenol, bisphenol A, bisphenol AP (1,1-bis(4-hydroxylphenyl)-1-phenyl ethane), bisphenol F, bisphenol K, tetrabromobisphenol A, phenol-formaldehyde novolac resins, alkyl substituted phenol-formaldehyde resins, phenol-hydroxybenzaldehyde resins, cresol-hydroxybenzaldehyde resins, dicyclopentadiene-phenol resins, dicyclopentadiene-substituted phenol resins tetramethylbiphenol, tetramethyl-tetrabromobiphenol, tetramethyltribromobiphenol, tetrachlorobisphenol A and any combination thereof.

Examples of diepoxides particularly useful in the present invention include diglcidyl ether of 2,2-bis(4-hydroxyphenyl)propane (generally referred to as bisphenol A) and diglycidyl ether of 2,2-bis(3,5-dibromo-4-hydroxyphenyl)propane (generally referred to as tetrabromobisphenol A). Mixtures of any two or more polyepoxides can also be used in the practice of the present invention.

Other useful epoxide compounds which can be used in the practice of the present invention are cycloaliphatic epoxides. A cycloaliphatic epoxide consists of a saturated carbon ring having an epoxy oxygen bonded to two vicinal atoms in the carbon ring for example as illustrated by the following general formula:

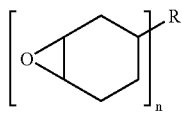

wherein R is as defined above and n is as defined above.

The cycloaliphatic epoxide may be a monoepoxide, a diepoxide, a polyepoxide, or a mixture of those. For example, any of the cycloaliphatic epoxide described in U.S. Pat. No. 3,686,359, incorporated herein by reference, may be used in the present invention. As an illustration, the cycloaliphatic epoxides that may be used in the present invention include, for example, (3,4-epoxycyclohexyl-methyl)-3,4-epoxy-cyclohexane carboxylate, bis-(3,4-epoxycyclohexyl)adipate, vinylcyclohexene monoxide and mixtures thereof.

The ratio of polyepoxide to hardener used in the epoxy resin composition of the present invention is such that the thermal properties of the resulting thermoset resin are maintained. The amounts of the hardener composition employed in the epoxy resin composition are such that the epoxy to hardener molar ratio is between about 0.5:1.0 and about 2.0:1.0, preferably between about 0.8:1.0 and about 1.2:1.0 and most preferably between about 0.9:1.0 and about 1.1:1.0.

In addition to the polyepoxide and hardener composition, the epoxy resin composition of the present invention may include a catalyst as an optional component. The catalyst may be a single component or a combination of two or more different catalysts. Catalysts useful in the present invention are those catalysts which catalyze the reaction of a polyepoxide with a cross-linker, and which remain latent in the presence of an inhibitor at lower temperatures. Preferably the catalyst is latent at temperatures of about 140° C. or below, and more preferably at about 150° C. or below. Latency is demonstrated by an increase of at least about 10 percent in gel time as determined by a stroke cure test performed at about 150° C. to about 170° C. Examples of preferred catalysts are compounds containing amine, phosphine, heterocyclic nitrogen, ammonium, phosphonium, arsonium or sulfonium moieties. Examples of more preferred catalysts are the heterocyclic nitrogen and amine containing compounds and even more preferred compounds are heterocyclic nitrogen containing compounds.

Any of the well known catalysts described in U.S. Pat. No. 4,925,901, incorporated herein by reference, may be used in the present invention. As an illustration, examples of the known catalysts that may be used in the present invention, include for example, suitable onium or amine compounds such as ethyltriphenyl phosphonium acetate, ethyltriphenyl phosphonium acetate-acetic acid complex, triethylamine, methyl diethanolamine, benzyldimethylamine, and imidazole compounds such as 2-methylimidazole and benzimidazole.

The catalysts, when present, are employed in a sufficient amount to result in a substantially complete cure of the epoxy resin, with some cross-linking. For example, the catalyst may be used in an amount of from about 0.01 to about 5 parts per hundred parts of resin, with from about 0.01 to about 1.0 parts per hundred parts of resin being preferred and from about 0.02 to about 0.5 catalyst per hundred parts of resin being more preferred.

Concentrations of components used to describe in the present invention are measured as parts by weight of components per hundred parts of resin by weight (phr), unless otherwise noted. The "resin" in the definition of "phr" herein refers to the polyepoxide and the hardener together in the composition.

Another optional component useful in the epoxy resin composition of the present invention is a reaction inhibitor. The reaction inhibitor may include boric acid, Lewis acids containing boron such as alkyl borate, alkyl borane, trimethoxyboroxine, an acid having a weak nucleophilic anion, such as, perchloric acid, tetrafluoboric acid, and organic acids having a pKa from 1 to 3, such as, salicylic acid, oxalic acid and maleic acid. Boric acid as used herein refers to boric acid or derivatives thereof, including metaboric acid and boric anhydride; and combinations of a Lewis acid with boron salts such as alkyl borate or trimethoxyboroxine. When an inhibitor is used in the present invention, boric acid is preferably used. The inhibitor and catalyst may be separately added, in any order, to the epoxy resin composition of the present invention, or may be added as a complex.

The amount of the inhibitor present relative to the catalyst in the epoxy resin composition of the present invention can be adjusted to adjust the gel time of the epoxy resin composition. At constant levels of catalyst, an increasing amount of inhibitor will yield a corresponding increase in the gel time. At a desired catalyst level the relative amount of inhibitor can be decreased to decrease the gel time. To increase the gel time the amount of inhibitor can be increased without changing the catalyst level.

The molar ratio of inhibitor (or mixture of different inhibitors) to catalyst is that ratio which is sufficient to significantly inhibit the reaction of the polyepoxide as exhibited by an increase in gel time as compared to a like composition free of inhibitor. Simple experimentation can determine the particular levels of inhibitor or mixtures which will increase in gel time but still allow a complete cure at elevated temperatures. For example, a preferable molar ratio range of inhibitor to catalyst where up to about 5.0 phr of boric acid is used, is from about 0.1:1.0 to about 10.0:1.0, with a more preferred range being from about 0.4:1.0 to about 7.0:1.0.

Another optional component which may be added to the epoxy resin composition of the present invention is a solvent or a blend of solvents. The solvent used in the epoxy resin composition is preferably miscible. In addition, an epoxy/hardener varnish containing the hardener composition of the present invention is a clear solution or a stable dispersion depending on the optional solvents used in the composition. Examples of suitable solvents employed in the present invention include for example ketones, ethers, acetates, aromatic hydrocarbons, cyclohexanone, dimethylformamide and combinations thereof.

Preferred solvents for the catalyst and the inhibitor are polar solvents. Lower alcohols having from 1 to 20 carbon atoms, such as for example methanol, provide good solubility and volatility for removal from the resin matrix when prepregs are formed.

Polar solvents are particularly useful to dissolve inhibitors of boric acid or Lewis acids derived from boron. If the polar solvents are hydroxy containing, there exists a potential competition for available carboxylic acid anhydride between the hydroxy moiety of the solvent and the secondary hydroxyl formed on opening of the oxirane ring. Thus, polar solvents which do not contain hydroxyl moieties are useful, for example, N,-methyl-2-pyrrolidone, dimethylsulfoxide, dimethylformamide, and tetrahydrofuran. Also useful are dihydroxy and trihydroxy hydrocarbons optionally containing ether moieties or glycol ethers having two or three hydroxyl groups. Particular useful are $C_{2-4}$ di- or trihydroxy compounds, for example 1,2-propane diol, ethylene glycol and glycerine. The polyhydroxy functionality of the solvent facilitates the solvent serving as a chain extender, or as a co-cross-linker according to the possible mechanism previously described concerning co-cross-linkers.

The total amount of solvent used in the epoxy resin composition generally may be between about 20 and about 60 weight percent, preferably between about 30 and about 50 weight percent, and most preferably between about 35 and about 45 weight percent.

The curable epoxy resin composition according to the present invention may contain usual additives such as fillers, dyes, pigments, thixotropic agents, surfactants, fluidity control agents, stabilizers, diluents that aid processing, adhesion promoters, flexibilizers, toughening agents and fire retardants.

The curable epoxy resin composition of the present invention can be produced by mixing all the components of the composition together in any order. Alternatively, the curable epoxy resin composition of the present invention can be produced by preparing a first composition comprising the epoxy resin component and a second composition comprising the hardener composition component. All other components useful in making the epoxy resin composition may be present in the same composition, or some may be present in the first composition, and some in the second composition. The first composition is then mixed with the second composition to form the curable epoxy resin composition. The epoxy resin composition mixture is then cured to produce an epoxy resin thermoset material. Preferably, the curable epoxy resin composition is in the form of a solution wherein the components of the composition are dissolved in a solvent. Such solution or varnish is used for producing a coated article.

The curable epoxy resin composition of the present invention may be used to coat any article for which a coating is desired. The article may be coated with the composition of the present invention using any method known to those skilled in the art, including for example powder-coating, spray-coating, and contacting the article with a bath containing the composition. Such article can be coated, with the epoxy resin composition, and the coating can be partially cured or fully cured. In the embodiment where the coating is partially cured, the article may be further processed such that the partially cured resin may be finally cured. The article coated can be any substrate, for example metal, cement and reinforcing material. In one embodiment, the article is a fibrous reinforcing material for composites, prepregs or laminates.

The curable epoxy resin composition according to the present invention can be employed to make composites for, inter alia, the electronics, construction, aviation, and automobile industries. The curable epoxy resin composition of the present invention may be used to make composite materials by techniques well known in the industry such as by impregnating a reinforcing material with molten or dissolved resin, or via resin transfer molding, filament winding, pultrusion or RIM (reaction injection molding) and other moulding, encapsulation, or coating techniques. Also, the curable epoxy resin compositions according to the present invention can be employed wherever use is made of conventional epoxy resins, such as a glue, coating, molding resin, embedding resin, encapsulating resin, sheet molding compound, or bulk molding compound.

The epoxy resin composition of the present invention is particularly useful for making B-staged prepegs and laminates, for example for printed wiring boards, by well known techniques in the industry. The present invention is preferably directed to laminates for use in the electronics industry incorporating the epoxy resin composition of the present invention. It was found that even when the resin composition is based on simple difunctional epoxy compounds, the combination of resin components according to the present invention will give excellent properties for application in the electronics industry.

Generally, laminates for use in the electronics industry, particularly for printed wiring boards, are produced by impregnating a supporting or reinforcing material with the epoxy resin composition of the present invention, followed by the resin being cured wholly or in part. A reinforcing material impregnated with a partially cured resin is usually referred to herein as the "prepeg". To make a printed wiring board from prepegs, one or more layers of prepegs are laminated with, for example, one or more layers of a metallic material such as copper.

The reinforcing material which may be impregnated with the epoxy resin composition of the present invention include any material which would be used by the skilled artisan in formation of composites, prepregs and laminates. Examples of the forms of such reinforcing materials are woven fabric, cloth, mesh, web, or fibers; or in the form of a cross-ply laminate of unidirectionally oriented parallel filaments. Generally, such reinforcing materials are made from a variety of materials such as glass fibers, paper, plastics such as aromatic polyamides, graphite, glass, quartz, carbon, boron fibers, and organic fibers such as for instance aramid, teflon, syndiotactic polystyrene, more particularly to make laminates for printed wiring boards. In one preferred embodiment, the reinforcing materials include glass or fiberglass, in cloth or web form. As an illustration of the present application, the epoxy resin composition according to the present invention are highly suitable for impregnating, for example, woven glass fabric.

In one embodiment of the present invention, the reinforcing material is contacted with the epoxy resin composition of the present invention in a bath. Preferably the bath contains from about 40 to about 90 percent solids. In such a bath, the various components of the epoxy resin composition are dissolved or suspended in the bath. A single solvent or solvent blend may be used for the bath, but in many applications a separate solvent is used for each component added to the mixture. It is preferable that the various solvents used be miscible with one another. Such solvents or diluents, include those which are volatile and escape from the composition prior to cure. Preferred solvents for the epoxy resins are ketones, including acetone and methyl ethyl ketone. Preferred solvents for the hardener composition are slightly polar solvents, amides, for example, dimethylformamide, ether alcohols, for example, methyl, ethyl, propyl or butyl ethers of ethylene glycol, ketones of methyl, ethyl, propyl or butyl, dipropylene glycol, ethylene glycol monomethylether, 1 methoxy-2-propanol, toluene, xylene methoxypropyl acetate, 2-ethoxyethyl acetate, and mixtures of solvents. The catalysts and inhibitors, for example, are preferably dissolved in polar solvents, in particular alcohols, preferably lower alkanols and most preferably methanol. Where the inhibitor is liquid or has high solubility in non-polar solvents, ketones may be used.

In one embodiment of the present invention, prepregs are prepared from the epoxy resin composition of the present invention and the reinforcing material by a process comprising first contacting the reinforcing material with an intimately mixed bath of the epoxy resin composition comprising: a polyepoxide in a solvent; a hardener composition of the present invention for the polyepoxide in a solvent; optionally, an inhibitor such as boric acid in a polar solvent; and optionally, a compound which catalyzes the curing of the polyepoxide with the hardener in a polar solvent. The reinforcing material is impregnated with the epoxy resin composition in the bath. Thereafter, the resin impregnated reinforcing material is passed through a heated zone at a temperature sufficient to cause the solvents in the composition to evaporate, but below the temperature at which the polyepoxide undergoes complete cure during the residence time in the heated zone.

The reinforcing material preferably has a residence time in the bath of from about 0.1 minute to about 10 minutes, more preferably from about 0.3 minute to about 8 minutes, and most preferably from about 0.5 minute to about 3 minutes. The temperature of such bath is preferably from about 0° C. to about 100° C., more preferably from about 10° C. to about 40° C. and most preferably from about 15° C. to about 30° C.

The residence time of the resin impregnated reinforcing material in the heated zone is from about 0.5 to about 15 minutes, more preferably from about 1 to about 10 minutes, and most preferably from about 1.5 to about 5 minutes. The temperature of the heated zone is sufficient to cause any solvents remaining in the epoxy resin composition to volatilize away, yet, not so high as to result in a complete curing of the components of the epoxy resin composition. Preferable temperatures of such heated zone are from about 80° C. to about 230° C., more preferably from about 100° C. to about 200° C., and most preferably from about 150° C. to about 180° C. Preferably, there is some means in the heated zone to remove the volatile solvent, either by passing an inert gas through the heated zone (which can be an oven) or drawing a slight vacuum on the oven. In other embodiments, the impregnated reinforcement materials may be exposed to zones of increasing temperature. For example, a first zone may be designed to cause the solvent to volatilize so the solvent can be removed, with subsequent zones designed to result in partial cure of the polyepoxide, that is, so called B-staging to form the prepreg.

In one embodiment of the present invention, laminates are manufactured from the prepreg material prepared above by contacting several layers, segments or parts of the prepreg material with one another. Thereafter, the contacted layers, segments or parts are exposed to elevated pressures and temperatures sufficient to cause the epoxy resin component in the resin composition to fully cure such that the resin on adjacent layers, segments or parts react to form a continuous epoxy resin matrix between and about the fibrous reinforcing material to form a laminate. Before being cured, the parts of prepreg material may be cut and stacked, or folded and stacked, into a part of desired shape and thickness.

The pressures used to press the prepregs, in a press means to prepare a laminate may be anywhere from about 10 to about 2000 newtons/cm$^2$, with from about 100 to about 1000 newtons/cm$^2$ being preferred. The temperature used to cure the prepreg material to form the laminates, depends upon the particular residence time, pressure used, and make up of the epoxy resin composition used. Generally, cure temperatures which may be used may be anywhere from about 100° C. to about 240° C., preferably from about 120° C. to about 210° C., and more preferably from about 170° C. to about 200° C. The residence time of the prepreg material in the press may be anywhere from about 30 minutes to about 300 minutes, preferably from about 45 to about 200 minutes, and more preferably from about 60 minutes to about 120 minutes.

One embodiment of a process for making a laminate may be a continuous process. In such a continuous process, the reinforcing material is taken from the oven and appropriately arranged into the desired shape and thickness and pressed at very high temperatures for short times, in particular such high temperatures are from about 180° C. to about 250° C., more preferably about 190° C. to about 210° C., at times of about 1 minute to about 10 minutes.

In an alternative embodiment of the present invention, it may be desirable to subject the laminate or final product to a post-cure step outside of the press. This post-cure step is designed to complete the curing reaction. The post-cure step is usually performed at from about 130° C. to about 220° C. for from about 20 minutes to about 200 minutes. This post-cure step may be performed in a vacuum to remove any components which may volatilize.

The ultimate fully cured laminate prepared from the curable epoxy resin composition of the present invention, often demonstrates a higher $T_g$ than laminates prepared from compositions not within the scope of the present invention.

Generally, the Tg of the laminate is from about 150° C. to about 220° C., and preferably from about 170° C. to about 200° C. Usually the Tg is higher for the laminate of the present invention than standard FR4 laminates. It is known that the Tg of a laminate can decrease when a toughening agent is used. However, a fully cured laminate using the resin composition of the present invention also exhibits improved toughness and less tendency to delaminate, while maintaining its Tg, than laminates prepared similarly using conventional resins formulated to give similar gel times (hence similar reactivity).

A laminate prepared using the epoxy resin composition of the present invention, also maintains its excellent thermal properties such as for example a high thermal resistance. For example, the Td is generally from about 300° C. to about 400° C., preferably from about 320° C. to about 380° C. and more preferably greater than about 350° C.

The dielectric properties of a laminate, especially Dk, are also improved when using the hardener composition of the present invention. When compared to standard FR4, the laminate of the present invention is typically better. The Dk is generally less than about 4.3, preferably less than about 4.2 and more preferably less than 4.0. The Df is generally less than about 0.020 GHz, preferably less then about 0.015 GHz and more preferably less than about 0.010 GHz.

In addition, a partly cured B-staged prepreg made from the epoxy/hardener composition of the present invention has improved cosmetics and generates less dust during handling. Generally, the prepreg dust is less than about 0.15 g/m, preferably less than about 0.10 g/m and more preferably less than about 0.08 g/m.

Furthermore, a fully cured C-staged laminate made from the epoxy/hardener composition of the present invention shows improved toughness and lower tendency to delamination. Generally, the present invention laminate shows at least a 10% improvement over laminates made from standard resins and up to ten times improvement. For example, the delamination values of laminates of the present invention may be about 1.0 J and above; and up to about 3.0 J. It is believed that PBMA or the blend of PBMA/SBM is acting as a toughening agent in the epoxy resin composition. Because PBMA reacts with the epoxy groups, large phase separation is prevented.

The present invention will be further illustrated with reference to the following Examples. The following Examples are set forth to illustrate the present invention and are not intended to limit the scope of the present invention. Unless otherwise stated all parts and percentages are by weight.

Various terms and designations for the materials used in the following Examples are explained as follows:

Dowanol™ PMA is a propylene glycol monomethyl ether acetate sold by The Dow Chemical Company.

MEK stands for methyl ethyl ketone.

SMA stands for styrene maleic anhydride copolymer.

PBMA stands for maleinized polybutadiene.

SBM stands for styrene-butadiene-methyl methacrylate triblock polymer.

SMA 3000™ is a styrene-maleic anhydride copolymer with an average molecular weight (Mw) of 9500 and an anhydride equivalent weight of 393 sold by Atofina.

Ricon™ 131MA10 is a maleinized polybutadiene with an average molecular weight (Mn) of 5000 and an anhydride equivalent weight of 981 sold by Sartomer.

Ricon™ 130MA13 is a maleinized polybutadiene with an average molecular weight Mn of 2900 and an anhydride equivalent weight of 762 sold by Sartomer.

SBM 1A17 is a styrene-butadiene-methyl methacrylate triblock polymer sold by Atofina.

D.E.N.™ 438 is a multifunctional epoxy novolac with an epoxy equivalent weight of 180 sold by The Dow Chemical Company.

D.E.R.™ 560 is a brominated epoxy resin with an epoxy equivalent weight of 450 sold by The Dow Chemical Company.

M780 is a brominated epoxy resin with an epoxy equivalent weight of 470 sold by Leuna Harze.

XU-19081.00 is an experimental brominated epoxy resin solution with an epoxy equivalent weight of 484 sold by The Dow Chemical Company.

Ken-React™ KR55 is a titanate adhesion promoter sold by Kenrich Petrochemical Inc.

2E4MI stands for 2-ethyl-4-methyl imidazole solution (20% non volatiles).

Hycar™ CTBN 1300×13 is a liquid reactive rubber, which is a carboxyl terminated butadiene-acrylonitrile copolymer with a molecular weight (Mn) of approximately 3150 and an average functionality of approximately 1.8. (Hycar™ is a trademark of Noveon.)

SBM 1A40 is a styrene-butadiene-methyl methacrylate triblock polymer sold by Atofina.

TBBA stands for tetrabromobisphenol A.

D.E.N.™ 431 is a multifunctional epoxy novolac with an epoxy equivalent weight of 176 sold by The Dow Chemical Company.

E.R.L.™ 4299 is a cycloaliphatic epoxy resin with an epoxy equivalent weight of 195 sold by The Dow Chemical Company.

Various experimental testing and analytical methods used for various measurements in the following Examples are as follows:

DSC stands for differential scanning colorimetry. Tg is measured by the mid-point Tg by DSC at a heating rate of 10° C./minute for films and at a heating rate of 20° C./minute for laminates. The method used was IPC-TM-650-#2.4.25C.

T-300 stands for time to delamination at 300° C. measured by thermo-mechanical analysis (TMA). The method used was IPC-TM-650-#2.4.24:1.

CTE stands for coefficient of thermal expansion measured by TMA.

Td stands for temperature of thermal degradation measured by thermo gravimetrical analysis (TGA). Td is the temperature at 5 wt % loss.

CISCO test (288° C.) is a measurement of thermal shock resistance. One cycle includes a solder dip at 288° C. for 10 seconds followed by a quenching in air at ambient temperature (25° C.) for 10 seconds (1 cycle=20 seconds).

Energy of delamination on impact is the energy required to reach delamination of the laminate on an impact. The equipment used in this test is a Byk Chemie impact tester model No 5510. The indentor used is a steel punch (2 lb) with a hemispherical head (diameter=⅝ inches). By gradually increasing the distance the weight drops, the height at which delamination occurs is determined (noted as Hd). The energy of delamination on impact (noted as E) is then calculated as follows:

$$E = mass \times distance \times acceleration$$

E=0.2262 Hd, where Hd is measured in inch and E in joule.

The higher the value of E, the better the toughness of the laminate and the higher the interlayer adhesion. This is also a measure of brittleness.

Copper peel strength was measured using the method described in IPC-TM-650-#2.4.8C.

TMA stands for thermo-mechanical analysis. The method used was IPC-TM-650-#2.4.24C.

Prepreg dust was measured as follows: About 20 sheets of prepreg having a width of about 30 cm were cut with a guillotine. The resulting dust coming off the prepreg was thoroughly collected and weighed. The weight of the prepreg dust was normalized to the total cutting distance (g/m).

EXAMPLE 1

In this example, an anhydride hardener solution of the present invention was prepared in a 5 L glass reactor, equipped with a mechanical stirrer, a heating jacket, a $N_2$ inlet and a dropping funnel. 1821.3 g of Dowanol* PMA and 40.3 g of SBM 1A17 were charged in the reactor and heated to 90° C. After the solids were completely dissolved, 1554.8 g of SMA 3000 was added to the solution. After the solids were completely dissolved, 201.3 g of Ricon* 131MA10 was added to the solution. Then the solution turned into a white turbid solution but was homogeneous. After 30 minutes, the solution was allowed to cool down to a temperature of 80° C. and MEK was introduced into the solution at 80° C. After complete cooling of the solution to ambient temperature (~25° C.), the anhydride hardener solution was turbid whitish homogeneous. The hardener solution remained stable during a testing period of 2 months without phase separation nor settling. The theoretical anhydride equivalent weight of the anhydride hardener solution was 432 (based on solids).

COMPARATIVE EXAMPLE A

A standard anhydride hardener solution was prepared in a 5 L glass reactor, equipped with a mechanical stirrer, a heating jacket, a $N_2$ inlet and a dropping funnel. 2000.0 g of Dowanol* PMA and 2000.0 g of SMA 3000 were charged in the reactor and heated to 90° C. Thirty minutes after the solids completely dissolved, the solution was allowed to cool down to ambient temperature (~25° C.). The anhydride hardener solution was clear pale yellow. The theoretical anhydride equivalent weight of the anhydride hardener solution was 393 (based on solids).

EXAMPLE 2

An anhydride hardener solution was prepared using the same procedure as described in Example 1. The anhydride hardener composition included 1821.3 g of cyclohexanone, 1510.0 g of SMA 3000, 238.7 g of Ricon* 130MA13, 47.7 g of SBM 1A17 and 364.3 g of MEK. The resulting anhydride hardener solution was turbid whitish homogeneous. The hardener solution remained stable during a testing period of 2 months without phase separation nor settling. The theoretical anhydride equivalent weight of the hardener solution was 431 (based on solids).

EXAMPLE 3

An anhydride hardener solution was prepared using the same procedure as described in Example 1. The anhydride hardener composition included 1821.3 g of cyclohexanone, 1490.6 g of SMA 3000, 254.9 g of Ricon* 131MA10, 51.0 g of SBM 1A17 and 364.3 g of MEK. The anhydride hardener solution was turbid whitish homogeneous. The hardener solution remained stable during a testing period of 2 months without phase separation nor settling. The theoretical anhydride equivalent weight of the hardener solution was 444 (based on solids).

EXAMPLE 4

An anhydride hardener solution was prepared using the same procedure as described in Example 1. The anhydride hardener composition included 1216.3 g of Dowanol* PMA, 1216.3 g of SMA 3000, 168.7 g of Ricon* 131MA10, 29.2 g of SBM 1A17 and 285.5 g of MEK. The anhydride hardener solution was turbid whitish homogeneous. The hardener solution remained stable during a testing period of 2 months without phase separation nor settling. The theoretical anhydride equivalent weight of the hardener solution was 433 (based on solids).

EXAMPLE 5

An anhydride hardener solution was prepared using the same procedure as described in Example 1. The anhydride hardener composition included 1122.2 g of Dowanol* PMA, 1050.3 g of SMA 3000, 60.7 g of Ricon* 131MA10, 12.1 g of SBM 1A17 and 112.8 g of MEK. The anhydride hardener solution was turbid whitish homogeneous. The hardener solution remained stable during a testing period of 2 months without phase separation nor settling. The theoretical anhydride equivalent weight of the hardener solution was 414 (based on solids).

EXAMPLE 6

An anhydride hardener solution was prepared using the same procedure as described in Example 1. The anhydride hardener composition included 1818.2 g of Dowanol* PMA, 1718.9 g of SMA 3000, 134.4 g of Ricon* 131MA10, 99.9 g of Ricon* 130MA13, 46.9 g of SBM 1A17 and 181.8 g of MEK. The anhydride hardener solution was turbid whitish homogeneous. The hardener solution remained stable during a testing period of 2 months without phase separation nor settling. The theoretical anhydride equivalent weight of the hardener solution was 430 (based on solids).

EXAMPLE 7 AND COMPARATIVE EXAMPLE B

In this example, prepregs and laminates were prepared by curing an epoxy solution (XU-19081.00 commercially available from The Dow Chemical Company) with the anhydride hardener solutions described in Comparative Example A and Example 1. The properties of the resulting prepregs and laminates were then compared.

Prepregs were produced by coating a varnish solution, as described in Table I, on woven glass (standard E-glass) and then drying and curing the varnish to an intermediate advancement point (B-stage prepreg) using a 3-meter long horizontal treater operating at 174° C. with a forced air flow. Prepregs were cut in sheets of 30 cm×30 cm.

Laminates were then prepared as follows: Eight sheets of prepregs were stacked together between copper foil and placed into a press. The sheets of prepregs were fully cured in the press at 190° C. for 90 minutes under 25,000 lbs of pressure. Depending on the melt viscosity of the prepreg powder, the pressure was adjusted to obtain enough flow, and therefore, a laminate thickness of about 1.5±0.1 mm. The copper foil layers were optionally etched to obtain unclad laminates. The resin content of the resulting laminates was about 43±3%.

TABLE I

| Components | Varnish 1 (Comparative Example B) | Varnish 2 (Example 7) |
|---|---|---|
| Compositions | | |
| XU-19081 (85% non volatiles) | 3132.4 g | 3561.9 g |
| Anhydride hardener solution from Comparative Example A | 2269.3 g | |
| Anhydride hardener solution from Example 1 | | 2112.7 g |
| Boric acid solution (20% non volatiles) | 17.5 g | 17.0 g |
| 2E4MI | 6.99 g | 6.80 g |
| Properties of Varnish | | |
| Varnish appearance | Clear, pale yellow | Turbid, whitish, homogeneous, |

TABLE I-continued

| Components | Varnish 1 (Comparative Example B) | Varnish 2 (Example 7) |
|---|---|---|
| Stroke cure reactivity at 170° C. | 271 seconds | stable 275 seconds |
| DSC film Tg [a] | 180.7° C. | 184.4° C. |
| Film appearance | Clear, brittle, bubbles | Opalescent, less brittle, less bubbles |
| Properties of Prepreg | | |
| Prepreg appearance | Regular, prepreg powder easy to take off, dusty prepreg ("mushroom" effect) | Regular, shiny, flexible, prepreg powder difficult to take off, non-dusty prepreg (no "mushroom" effect) |
| Prepreg dust | 0.172 g/m | 0.064 g/m |
| Prepreg stability at 40° C. under a 3 kg load | Prepreg sheets do not stick together after 1 week | Prepreg sheets do not stick together after 1 week |
| Properties of Laminates | | |
| Laminate appearance | Yellow, translucent | Yellow, translucent |
| DSC Tg (laminate) | 185.6° C. | 186.8° C. |
| CTE < Tg | 74 ppm/K | 84 ppm/K |
| CTE > Tg | 233 ppm/K | 257 ppm/K |
| T 300 | 42 minutes | 46 minutes |
| Cu peel | 8.2 N/cm | 9.3 N/cm |
| Solder dip at 288° C. | >6 minutes | >6 minutes |
| CISCO test (288° C.) | >6 minutes (>18 cycles) | >10 minutes (>30 cycles) |
| Td | 369° C. | 369° C. |
| E (Energy of delamination on impact test) | 0.34 J | 1.36 J |
| Dk at 1 MHz | 4.25 | 3.67 |
| Dk at 100 MHz | 4.17 | 3.62 |
| Dk at 1 GHz | 4.09 | 3.52 |
| Df at 1 MHz | 0.006 | 0.008 |
| Df at 100 MHz | 0.006 | 0.006 |
| Df at 1 GHz | 0.007 | 0.006 |

[a] Curing schedule: 10 minutes at 170° C. + 90 minutes at 190° C. on a hot plate.

The results in Table I above shows that using the anhydride hardener of the present invention significantly improves the properties of a system as compared to using a standard anhydride hardener, both for a prepreg and for a laminate. The anhydride hardener of the present invention led to a much less dusty prepreg which is consequently much easier to handle. The hardener of the present invention also greatly increased the laminate toughness, the energy of delamination on impact being 4 times higher than for the laminate of Comparative Example A. The dielectric constants, especially Dk, were lower when the anhydride hardener solution of Example 1 was used. The excellent thermal properties of the laminate were also maintained using the hardener of the present invention.

COMPARATIVE EXAMPLE C

This example describes the properties of prepregs and laminates prepared from curing Leuna M780 epoxy solution with the anhydride hardener solution described in Comparative Example A.

Prepregs and laminates were prepared using the same procedure as described in Example 7, except that the press was operated at 32,000 lbs of pressure.

TABLE II

| Components | Varnish 3 (Comparative Example C) |
|---|---|
| Composition | |
| Leuna M780 solution (70% non volatiles) | 2343.7 g |
| Anhydride hardener solution from Comparative Example A | 2888.0 g |
| Boric acid solution (20% non volatiles) | 61.7 g |
| 2E4MI | 15.4 g |
| Properties of Varnish | |
| Varnish appearance | Clear yellow |
| Stroke cure reactivity at 170° C. | 242 seconds |
| DSC film Tg [a] | 187.4° C. |
| Properties of Prepreg | |
| Prepreg appearance | Foamy, prepreg powder easy to take off ("mushroom" effect) |
| Prepreg dust | 0.284 g/m |
| Prepreg stability at 40° C. under a 3 kg load | Prepreg sheets do not stick together after 1 week |
| Properties of Laminates | |
| Laminate appearance | Yellow, opalescent |
| DSC Tg (laminate) | 187.3° C. |
| CTE < Tg | 54 ppm/K |
| CTE > Tg | 223 ppm/K |
| T 300 | >30 minutes |
| Solder dip at 288° C. | >3 minutes |
| E (Energy of delamination on impact test) | 0.90 J |

[a] Curing schedule: 10 minutes at 170° C. + 90 minutes at 190° C. on a hot plate The results in Table II above show that the use of a standard anhydride hardener led to a dusty prepreg and a brittle laminate.

EXAMPLE 8

This example describes the properties of prepregs and laminates prepared from curing DER*560 epoxy solution with the anhydride hardener solution described in Example 2.

Prepregs and laminates were prepared using the same procedure as described in Example 7, except that the press was operated at 60,000 lbs of pressure.

TABLE III

| Components | Varnish 4 (Example 8) |
|---|---|
| Composition | |
| DER*560 solution (65% non volatiles) | 2355.6 g |
| Anhydride hardener solution from Example 2 | 3258.8 g |
| Boric acid solution (20% non volatiles) | 14.7 g |
| 2E4MI | 12.0 g |
| Properties of Varnish | |
| Varnish appearance | Clear, dark yellow, stable, homogeneous |
| Stroke cure reactivity at 170° C. | 270 seconds |
| DSC film Tg [a] | 179.9° C. |
| Properties of Prepreg | |

TABLE III-continued

| Components | Varnish 4 (Example 8) |
|---|---|
| Prepreg appearance | Shiny, flexible, prepreg powder difficult to take off (no "mushroom" effect) |
| Prepreg dust | 0.031 g/m |
| Prepreg stability at 40° C. under a 3 kg load | Prepreg sheets do not stick together after 1 week |
| *Properties of Laminates* | |
| Laminate appearance | Yellow, opaque |
| UL 94 rating | V-0 |
| DSC Tg (laminate) | 184.1° C. |
| CTE < Tg | 52 ppm/K |
| CTE > Tg | 204 ppm/K |
| T 300 | >30 minutes |
| Td | 368° C. |
| Solder dip at 288° C. | >5 min. |
| CISCO test (288° C.) | >10 minutes (>30 cycles) |
| E (Energy of delamination on impact test) | 2.26 J |
| Dk at 1 MHz | 3.91 |
| Dk at 100 MHz | 3.83 |
| Dk at 1 GHz | 3.75 |
| Df at 1 MHz | 0.008 |
| Df at 100 MHz | 0.007 |
| Df at 1 GHz | 0.009 |

[a] Curing schedule: 10 minutes at 170° C. + 90 minutes at 190° C. on a hot plate The results in Table III above show that the use of the anhydride hardener of the present invention significantly improved the system properties compared to a standard anhydride hardener, both for the prepreg and for the laminate. The anhydride hardener led to much less dusty prepreg, 9 times less prepreg dust is generated during cutting compared to the Comparative Example C, which is consequently much easier to handle. It also greatly increased the laminate toughness, the energy of delamination on impact being 2.5 times higher than for the Comparative Example C. The excellent thermal properties and dielectric constants were maintained.

EXAMPLE 9

This example describes the properties of prepregs and laminates prepared from curing DER*560 epoxy solution with the anhydride hardener solution described in Example 3.

Prepregs and laminates were prepared using the same procedure as described in Example 7, except that the press was operated at 45,000 lbs of pressure.

TABLE IV

| Components | Varnish 5 (Example 9) |
|---|---|
| *Composition* | |
| DER*560 solution (65% non volatiles) | 2321.3 g |
| Anhydride hardener solution from Example 3 | 3293.4 g |
| Boric acid solution (20% non volatiles) | 14.9 g |
| 2E4MI | 12.0 g |
| *Properties of Varnish* | |
| Varnish appearance | Whitish yellow, homogeneous, stable |

TABLE IV-continued

| Components | Varnish 5 (Example 9) |
|---|---|
| Stroke cure reactivity at 170° C. | 274 seconds |
| DSC film Tg [a] | 184.9° C. |
| *Properties of Prepreg* | |
| Prepreg appearance | Shiny, flexible, prepreg powder difficult to take off (no "mushroom" effect) |
| Prepreg stability at 40° C. under a 3 kg load | Prepreg sheets do not stick together after 1 week |
| *Properties of Laminates* | |
| Laminate appearance | Yellow, opaque |
| UL 94 rating | V-0 |
| T 300 | >30 minutes |
| Td | 365° C. |
| Solder dip at 288° C. | >6 minutes |
| CISCO test (288° C.) | >6 minutes (>18 cycles) |
| E (Energy of delamination on impact test) | 2.83 J |
| Dk at 1 MHz | 3.72 |
| Dk at 100 MHz | 3.65 |
| Dk at 1 GHz | 3.58 |
| Df at 1 MHz | 0.006 |
| Df at 100 MHz | 0.006 |
| Df at 1 GHz | 0.011 |

[a] Curing schedule: 10 minutes at 170° C. + 90 minutes at 190° C. on a hot plate The results in Table IV above show that the use of the anhydride hardener of the present invention significantly improved the system properties compared to a standard anhydride hardener, both for the prepreg and for the laminate. The anhydride hardener of the present invention led to a much less dusty prepreg which is consequently much easier to handle. It also greatly increased the laminate toughness, the energy of delamination on impact being 3.1 times higher than for the Comparative Example C. The excellent thermal properties and dielectric constants were kept.

EXAMPLE 10

This example describes the properties of prepregs and laminates prepared from curing Leuna M780 epoxy solution with the anhydride hardener solution described in Example 4.

Prepregs and laminates were prepared using the same procedure as described in Example 7, except that the press was operated at 30,000 lbs of pressure.

TABLE V

| Components | Varnish 6 (Example 10) |
|---|---|
| *Composition* | |
| Leuna M780 solution (70% non volatiles) | 2193.4 g |
| Anhydride hardener solution from Example 4 | 2915.8 g |
| KR55 | 24.3 g |
| Boric acid solution (20% non volatiles) | 58.4 g |
| 2E4MI | 14.6 g |
| *Properties of Varnish* | |
| Varnish appearance | Turbid, whitish, homogeneous, stable |

TABLE V-continued

| Components | Varnish 6 (Example 10) |
|---|---|
| Stroke cure reactivity at 170° C. | 208 seconds |
| DSC film Tg [a] | 170.7° C. |
| *Properties of Prepreg* | |
| Prepreg appearance | Shiny, flexible, prepreg powder difficult to take off (no "mushroom" effect) |
| *Properties of Laminates* | |
| Laminate appearance | Yellow whitish, opaque |
| DSC Tg (laminate) | 183.2° C. |
| CTE < Tg | 57 ppm/K |
| CTE > Tg | 220 ppm/K |
| Cu peel | 10.3 N/cm |
| Solder dip at 288° C. | >5 minutes |
| CISCO test (288° C.) | >5 minutes |
| E (Energy of delamination on impact test) | 1.36 J |
| Dk at 1 MHz | 4.25 |
| Dk at 100 MHz | 4.20 |
| Dk at 1 GHz | 4.10 |
| Df at 1 MHz | 0.0095 |
| Df at 100 MHz | 0.010 |
| Df at 1 GHz | 0.0095 |

[a] Curing schedule: 10 minutes at 170° C. + 90 minutes at 190° C. on a hot plate The results in Table VI above show that the use of the anhydride hardener of the present invention led to a non-dusty prepreg which is consequently easy to handle. It also led to a good laminate toughness. The thermal properties and the dielectric constant were excellent.

EXAMPLE 11

This example describes the properties of prepregs and laminates prepared from curing Leuna M780 epoxy solution with the anhydride hardener solution described in Example 5.

Prepregs and laminates were prepared using the same procedure as described in Example 7, except that the press was operated at 30,000 lbs of pressure.

TABLE VI

| Components | Varnish 7 (Example 12) |
|---|---|
| *Composition* | |
| Leuna M780 solution (70% non volatiles) | 1799.0 g |
| Anhydride hardener solution from Example 5 | 2380.7 g |
| KR55 | 39.8 g |
| Boric acid solution (20% non volatiles) | 47.7 g |
| 2E4MI | 10.7 g |
| *Properties of Varnish* | |
| Varnish appearance | Yellow, homogeneous, stable, opalescent |
| Stroke cure reactivity at 170° C. | 259 seconds |
| DSC film Tg [a] | 170.0° C. |
| *Properties of Prepreg* | |
| Prepreg appearance | Relatively foamy, prepreg powder relatively easy to take off (small "mushroom" effect) |
| *Properties of Laminates* | |

TABLE VI-continued

| Components | Varnish 7 (Example 12) |
|---|---|
| Laminate appearance | Yellow, opalescent |
| DSC Tg (laminate) | 178.7° C. |
| E (Energy of delamination on impact test) | 1.13 J |
| Dk at 1 MHz | 4.29 |
| Dk at 100 MHz | 4.21 |
| Dk at 1 GHz | 4.16 |
| Df at 1 MHz | 0.009 |
| Df at 100 MHz | 0.007 |
| Df at 1 GHz | 0.010 |

[a] Curing schedule: 10 minutes at 170° C. + 90 minutes at 190° C. on a hot plate The results show that the use of the anhydride hardener of the present invention led to a good laminate toughness. The thermal properties and the dielectric constant were excellent.

EXAMPLE 12

This example describes the properties of prepregs and laminates prepared from curing a blend of DER*560 and DEN*438 epoxy solution with the anhydride hardener solution described in Example 6.

Prepregs and laminates were prepared using the same procedure as described in Example 7, except that the press was operated at 23,000 lbs of pressure.

TABLE VII

| Components | Varnish 8 Example 12 |
|---|---|
| *Composition* | |
| DER*560 solution (65% non volatiles) | 1967.1 g |
| DEN*438 | 175.2 g |
| Anhydride hardener solution from ion was 414 (based on solids). Example 7 | 3277.6 |
| Boric acid solution (20% non volatiles) | 29.2 g |
| 2E4MI | 7.7 g |
| *Properties of Varnish* | |
| Varnish appearance | Yellow, homogeneous, stable, turbid |
| Stroke cure reactivity at 170° C. | 276 seconds |
| DSC film Tg [a] | 182.9° C. |
| *Properties of Prepreg* | |
| Prepreg appearance | Shiny, flexible, prepreg powder difficult to take off (no "mushroom" effect) |
| *Properties of Laminates* | |
| Laminate appearance | Yellow, opalescent |
| DSC Tg (laminate) | 181.1° C. |
| CTE < Tg | 68 ppm/K |
| CTE > Tg | 163 ppm/K |
| T 300 | >30 minutes |
| Cu peel | 8.2 N/cm |
| E (Energy of delamination on impact test) | 2.26 J |
| Dk at 1 MHz | 3.73 |
| Dk at 100 MHz | 3.67 |
| Dk at 1 GHz | 3.63 |
| Df at 1 MHz | 0.005 |

TABLE VII-continued

| Components | Varnish 8 Example 12 |
|---|---|
| Df at 100 MHz | 0.007 |
| Df at 1 GHz | 0.011 |

(a) Curing schedule: 10 minutes at 170° C. + 90 minutes at 190° C. on hot plate

The results in Table VII above show that the use of the anhydride hardener of the present invention led to a good laminate toughness. The thermal properties and the dielectric constant were excellent.

EXAMPLE 13

An anhydride hardener solution was prepared using the same procedure as described in Example 1. The anhydride hardener composition included 1750.0 g of Dowanol* PMA, 1857.1 g of SMA 3000, 215.9 g of Ricon* 131MA10, 27.0 g of SBM 1A40 and 350.0 g of MEK. The anhydride hardener solution was turbid whitish and homogeneous. The hardener solution remained stable during a testing period of 2 months without phase separation nor settling. The theoretical anhydride equivalent weight of the hardener solution was 424 (based on solids).

EXAMPLE 14

An anhydride hardener solution was prepared using the same procedure as described in Example 1. The anhydride hardener composition included 1800.0 g of Dowanol* PMA, 1449.2 g of SMA 3000, 215.0 g of Ricon* 130MA13, 35.8 g of SBM 1A17 and 300.0 g of MEK. The anhydride hardener solution was turbid whitish homogeneous. The hardener solution remained stable during a testing period of 2 months without phase separation nor settling. The theoretical anhydride equivalent weight of the hardener solution was 420 (based on solids).

EXAMPLE 15

An anhydride hardener solution was prepared using the same procedure as described in Example 1. The anhydride hardener composition included 3671.9 g of Dowanol* PMA, 3623.2 g of SMA 3000, 730.7 g of Ricon* 130MA13, 146.1 g of SBM 1A17 and 828.1 g of MEK. The anhydride hardener solution was turbid whitish homogeneous. The hardener solution remained stable during a testing period of 2 months without phase separation nor settling. The theoretical anhydride equivalent weight of the hardener solution was 439 (based on solids).

COMPARATIVE EXAMPLE D

This example describes the properties of prepregs and laminates prepared from curing an epoxy solution (XU-19081.00 commercially available from The Dow Chemical Company) with the anhydride hardener described in Comparative Example A and with 5 phr of a liquid rubber toughening agent CTBN 1300×13. Prepregs were produced by coating a varnish solution as described in Table VIII on woven glass (standard E-glass) by hand lay-up technique and then drying and curing the coated woven glass to an intermediate advancement point (B-stage prepreg) using a ventilated oven operating at 175° C. with a forced air flow. Laminates were prepared by cutting prepregs in sheets of 30 cm×30 cm and then copper foils were pressed in between the prepregs as described in Example 7.

This Comparative Example D may be compared with Example 7 and Comparative Example B.

TABLE VIII

| Components | Varnish 9 (Comparative Example D) |
|---|---|
| Composition | |
| XU-19081 (85% non volatiles) | 165.6 g |
| Anhydride hardener from Example 1 | 134.4 g |
| CTBN 1300X13 solution (60% non volatiles) | 15.0 g |
| Boric acid solution (20% non volatiles) | 0.30 g |
| 2E-4MI | 0.12 g |
| Properties of Varnish | |
| Varnish appearance | Translucent |
| Stroke cure reactivity at 170° C. | 306 seconds |
| DSC film Tg (a) | 157° C. |
| Film appearance (a) | Opalescent, less brittle, less bubbles than Comparative Example B |
| Properties of Prepreg | |
| Prepreg appearance | Regular, relatively dusty |
| Prepreg stability at 40° C. under a 3 kg load | Prepreg sheets sticks together after 1 week |
| Properties of Laminates | |
| DSC laminate Tg | 168° C. |
| Cu peel | 8.6 N/cm |
| E (Energy of delamination on impact test) | 0.57 J |

(a) Curing schedule: 10 minutes at 170° C. + 90 minutes at 190° C. on a hot plate The results in Table VIII above show that the use of a liquid rubber toughening agent improved some properties compared to the reference system produced with Varnish 1 Comparative Example B (toughening, copper peel strength), but also dramatically impacted some other properties (Tg, prepreg stability at 40° C.). The use of improved anhydride hardener as described in Varnish 2 (Example 7) led to much better overall performances.

EXAMPLE 16

This example describes the properties of prepregs and laminates prepared from curing a DEN*431 epoxy solution with TBBA and the anhydride solution described in Example 13.

Prepregs and laminates were prepared using the same procedure as described in Example 7.

TABLE IX

| Components | Varnish 10 (Example 16) |
|---|---|
| Composition | |
| DEN*431 solution (67.3% non volatiles) | 1968.1 g |
| TBBA | 1135.4 g |
| Anhydride hardener | 2307.1 g |

TABLE IX-continued

| Components | Varnish 10 (Example 16) |
|---|---|
| solution from Example 13 | |
| Boric acid solution | 23.45 g |
| (20% non volatiles) | |
| MEK | 310.8 g |
| 2E4MI | 6.12 g |
| Properties of Varnish | |
| Varnish appearance | Yellow opalescent |
| Stroke cure reactivity at 170° C. | 235 seconds |
| DSC film Tg [a] | 168.7° C. |
| Film appearance [a] | Yellow opalescent |
| Properties of Prepreg | |
| Prepreg appearance | Nice shiny, prepreg powder difficult to take off (no "mushroom" effect) |
| Prepreg stability at 40° C. under a 3 kg load | Prepreg sheets stick together after 1 week |
| Properties of Laminates | |
| Laminate appearance | Yellow opalescent |
| DSC laminate Tg | 167.9° C. |
| Cu peel | 12.2 N/cm |

[a] Curing schedule: 10 minutes at 170° C. + 90 minutes at 190° C. on a hot plate The results in Table IX above show that the use of the anhydride hardener of the present invention with the blend of DEN*431 and TBBA led to nice prepreg with relatively good adhesion to copper.

EXAMPLE 17

This example describes the properties of prepregs and laminates prepared from curing a blend of DER*560 and DEN*438 epoxy solution with the anhydride hardener solution described in Example 14.

Prepregs and laminates were prepared using the same procedure as described in Example 7.

TABLE X

| Components | Varnish 11 (Example 17) |
|---|---|
| Composition | |
| DER*560 solution | 2891.1 g |
| (65% non volatiles) | |
| DEN*438 solution | 366.3 g |
| (70.3% non volatiles) | |
| Anhydride hardener solution from Example 14 | 4705.0 g |
| Boric acid | 42.9 g |
| (20% non volatiles) | |
| 2E4MI | 11.24 g |
| Properties of Varnish | |
| Varnish appearance | Yellowish opalescent |
| Stroke cure reactivity at 170° C. | 276 seconds |
| DSC film Tg [a] | 179° C. |
| Properties of Prepreg | |
| Prepreg appearance | Shiny, prepreg powder difficult to take off (no "mushroom" effect) |
| Prepreg dust | 0.100 g/m |
| Prepreg stability | Prepreg sheets do not stick |

TABLE X-continued

| Components | Varnish 11 (Example 17) |
|---|---|
| at 40° C. under a 3 kg load | together after 1 week |
| Properties of Laminates | |
| Laminate appearance | Whitish opaque |
| DSC Tg (laminate) | 179.6° C. |
| CTE < Tg | 84 ppm/K |
| CTE > Tg | 269 ppm/K |
| T 300 | 32 minutes |
| Cu peel | 9.0 N/cm |
| UL 94 rating | V-0 |
| Td | 366° C. |

[a] Curing schedule: 10 minutes at 170° C. + 90 minutes at 190° C. on a hot plate The results in Table X above show that the use of the anhydride hardener of the present invention led to a laminate with excellent overall properties.

EXAMPLE 18

This example describes the properties of prepregs and laminates prepared from curing a blend of DER*560 and ERL-4299 epoxy solution with the anhydride hardener solution described in Example 14.

Prepregs and laminates were prepared using the same procedure as described in Example 7.

TABLE XI

| Components | Varnish 12 (Example 18) |
|---|---|
| Composition | |
| DER*560 solution | 2327.4 g |
| (65% non volatiles) | |
| ERL-4299 solution | 294.9 g |
| (70.3% non volatiles) | |
| Anhydride hardener solution from Example 14 | 3542.5 g |
| Boric acid | 34.5 g |
| (20% non volatiles) | |
| 2E4MI | 8.75 g |
| Properties of Varnish | |
| Varnish appearance | Opalescent to opaque homogeneous, yellowish, low viscosity |
| Stroke cure reactivity at 170° C. | 263 seconds |
| DSC film Tg [a] | 182.6° C. |
| Properties of Prepreg | |
| Prepreg appearance | Nice shiny |
| Properties of Laminates | |
| Laminate appearance | Yellowish opalescent |
| DSC Tg (laminate) | 178.3° C. |
| Cu peel | 7.2 N/cm |
| UL 94 rating | V-1 |
| Dk at 1 MHz | 3.79 |
| Dk at 100 MHz | 3.70 |
| Dk at 1 GHz | 3.68 |
| Df at 1 MHz | 0.0066 |
| Df at 100 MHz | 0.0075 |
| Df at 1 GHz | 0.0083 |

[a] Curing schedule: 10 minutes at 170° C. + 90 minutes at 190° C. on a hot plate The results in Table XI above show that the use of the anhydride hardener of the present invention led to laminate with excellent thermal and electrical properties.

EXAMPLE 19

This example describes the properties of prepregs and laminates prepared from curing a blend of DER*560 and DEN*438 epoxy solution with the anhydride hardener solution described in Example 15.

Prepregs and laminates were prepared using the same procedure as described in Example 7.

TABLE XII

| Components | Varnish 13 (Example 19) |
|---|---|
| Composition | |
| DER*560 solution (65% non volatiles) | 2205.3 g |
| DEN* 438 solution (68% non volatiles) | 292.5 g |
| Anhydride hardener solution from Example 15 | 3683.9 g |
| 3-glycidyloxypropyl trimethoxysilane | 17.5 g |
| Boric acid (20% non volatiles) | 33.1 g |
| 2E4MI | 7.87 g |
| Properties of Varnish | |
| Varnish appearance | Light orange opaque |
| Stroke cure reactivity at 170° C. | 207 seconds |
| DSC film Tg[a] | 175.4° C. |
| Properties of Prepreg | |
| Prepreg appearance | Nice shiny regular |
| Properties of Laminates | |
| Laminate appearance | Whitish opaque |
| DSC Tg (laminate) | 180.3° C. |
| Cu peel | 7.8 N/cm |
| DSC Tg (laminate with treated copper[b]) | 182.5° C. |
| Cu peel (laminate with treated copper[b]) | 16.0 N/cm |

[a]Curing schedule: 10 minutes at 170° C. + 90 minutes at 190° C. on a hot plate;
[b]resin coated copper foil (epoxy resin = DER*592-A80, B-staged)

The results in Table XII above show that the use of the anhydride hardener of the present invention led to a laminate with good thermal properties and excellent adhesion on resin coated copper foil.

What is claimed is:

1. A hardener composition useful for curing a polyepoxide resin comprising a blend of
    (a) a carboxylic anhydride which is a copolymer of an ethylenically unsaturated anhydride and a vinyl compound;
    (b) a copolymer of an ethylenically unsaturated anhydride and an elastomer; and
    (c) a stabilizing agent to prevent phase separation of components (a) and (b), wherein the amount of component (b) present in the composition is such that the component (a) to component (b) weight ratio is between about 95:5 and about 83:17.

2. The hardener composition of claim 1 wherein the copolymer of an ethylenically unsaturated anhydride and a vinyl compound is a copolymer of styrene and maleic anhydride (SMA).

3. The hardener composition of claim 1 wherein the copolymer of an ethylenically unsaturated anhydride and an elastomer is a maleic anhydride-modified polybutadiene (PBMA).

4. The hardener composition of claim 1 wherein the stabilizing agent is a block copolymer.

5. The hardener composition of claim 1 wherein the stabilizing agent is a triblock copolymer of styrene-butadiene-methyl methacrylate (SBM).

6. The hardener composition of claim 1 including (d) a solvent.

7. The hardener composition of claim 1 including (e) a cure inhibitor.

8. The hardener composition of claim 7 wherein the cure inhibitor is boric acid.

9. The hardener composition of claim 1 wherein the amount of the carboxylic anhydride which is a copolymer of an ethylenically unsaturated anhydride and a vinyl compound present in the composition is such that the epoxy to anhydride molar ratio is between about 0.8:1.0 and about 1.2:1.0.

10. The hardener composition of claim 1 wherein the amount of component (b) present in the composition is such that the component (a) to component (b) weight ratio is between about 95:5 and about 85:15.

11. The hardener composition of claim 1 wherein the amount of stabilizing agent present in the composition is such that the component (b) to component (c) weight ratio is between about 60:40 and about 95:5.

12. A process for preparing a hardener composition comprising mixing
    (a) a carboxylic anhydride which is a copolymer of an ethylenically unsaturated anhydride and a vinyl compound;
    (b) a copolymer of an ethylenically unsaturated anhydride of an elastomer; and
    (c) a stabilizing agent to prevent phase separation of components (a) and (b), wherein the amount of component (b) present in the composition is such that the component (a) to component (b) weight ratio is between about 95:5 and about 83:17.

* * * * *